(12) United States Patent
Wang et al.

(10) Patent No.: US 7,842,964 B2
(45) Date of Patent: Nov. 30, 2010

(54) FRONT AND REAR COVERING TYPE LED PACKAGE STRUCTURE AND METHOD FOR PACKAGING THE SAME

(75) Inventors: Bily Wang, Hsinchu (TW); Jonnie Chuang, Banciao (TW); Hui-Yen Huang, Hsinchu (TW); Chao-Yuan Huang, Tai Chung (TW)

(73) Assignee: Harvatek Corporation, Hsinchu (TW)

( * ) Notice: Subject to any disclaimer, the term of this patent is extended or adjusted under 35 U.S.C. 154(b) by 411 days.

(21) Appl. No.: 12/003,523

(22) Filed: Dec. 28, 2007

(65) Prior Publication Data
US 2009/0050922 A1    Feb. 26, 2009

(30) Foreign Application Priority Data
Aug. 20, 2007   (TW) .............................. 96130757 A

(51) Int. Cl.
 *H01L 29/861*    (2006.01)
(52) U.S. Cl. ................. 257/99; 257/100; 257/E33.058; 257/E33.059; 257/E33.062; 438/26; 438/123; 438/127

(58) Field of Classification Search ....................... None
See application file for complete search history.

(56) References Cited

U.S. PATENT DOCUMENTS

2006/0226435 A1*   10/2006   Mok et al. .................... 257/98

* cited by examiner

*Primary Examiner*—Minh-Loan T Tran
*Assistant Examiner*—Fei Fei Yeung Lopez
(74) *Attorney, Agent, or Firm*—Rosenberg, Klein & Lee

(57) ABSTRACT

A front and rear covering type LED package structure includes an insulating body, a substrate unit, at least one light-emitting element, and a package colloid. The insulating body has a receiving space. The substrate unit has two electrode pins separated from each other. Each electrode pin has one side covered by the insulating body. Each electrode pin has another side bent into a U-shape and exposed outside the insulating body in order to cover two opposite lateral sides and front and rear sides of the insulating body by a front and rear covering method. The at least one light-emitting element is received in the receiving space and electrically connected with the two electrode pins of the substrate unit. The package colloid is filled into the receiving space of the insulating body.

27 Claims, 14 Drawing Sheets

FRONT AND REAR COVERING TYPE LED PACKAGE STRUCTURE AND METHOD FOR PACKAGING THE SAME

BACKGROUND OF THE INVENTION

1. Field of the Invention

The present invention relates to an LED package structure and a method for packaging the same, and particularly relates to a front and rear covering type LED package structure and a method for packaging the same.

2. Description of the Related Art

FIG. 1 shows a cross-sectional, schematic view of a vertical LED chip package structure of the prior art. The vertical LED chip package structure includes an insulating substrate 1a, a lead frame 2a, an LED chip 3a, and a fluorescent colloid 4a.

The lead frame 2a has two conductive pins 20a, 21a respectively extended along two opposite lateral sides and bent twice, so that the bottom faces of the two conductive pins 20a, 21a are electrically connected with a PCB 5a. In addition, the conductive pin 20a has a positive electrode area 200a, and the conductive pin 21a has a negative electrode area 210a.

Moreover, the LED chip 3a has a positive electrode 300a and a negative electrode 310a. The LED chip 3a is disposed on the conductive pin 20a directly, so that the positive electrode 300a of the LED chip 3a is directly electrically connected with the positive electrode area 200a of the conductive pin 20a. The negative electrode 310a of the LED chip 3a is electrically connected with the negative electrode area 210a of the conductive pin 21a via a wire 6a.

The fluorescent colloid 4a is covered on the LED chip 3a for protecting the LED chip 3a. Therefore, the vertical LED chip package structure should project light upwardly (such as the arrows in FIG. 1).

However, if the conductive pins (20a, 21a) want to be electrically connected with the PCB 5a, the conductive pins (20a, 21a) need to be bent twice. Therefore, the manufacturing process in the prior art is complex and should be simplified.

SUMMARY OF THE INVENTION

One particular aspect of the present invention is to provide a front and rear covering type LED package structure and a method for packaging the same. The present invention utilizes a simple two-step bending process to make electrode pins bent to form U-shapes in order to cover two opposite lateral sides and front and rear sides of an insulating body.

In order to achieve the above-mentioned aspects, the present invention provides a front and rear covering type LED package structure, including an insulating body, a substrate unit, at least one light-emitting element, and a package colloid. The insulating body has a receiving space. The substrate unit has two electrode pins separated from each other. Each electrode pin has a first side covered by the insulating body, and each electrode pin has a second side bent into a U-shape and exposed outside the insulating body in order to cover two opposite lateral sides and front and rear sides of the insulating body by front and rear covering. The light-emitting element is received in the receiving space and electrically connected with the two electrode pins of the substrate unit. The package colloid is filled into the receiving space of the insulating body.

In order to achieve the above-mentioned aspects, the present invention provides a method for packaging a front and rear covering type LED package structure, including: covering a substrate unit in an insulating body, wherein the insulating body has a receiving space, and the substrate unit has two electrode pins separated from each other, wherein each electrode pin has a first side covered by the insulating body, and each electrode pin has a second side exposed outside the insulating body; receiving at least one light-emitting element in the receiving space and disposing the at least one light-emitting element on the substrate unit; electrically connecting the at least one light-emitting element with the two electrode pins of the substrate unit; filling a package colloid into the receiving space of the insulating body; and bending each second side of each electrode pin in order to cover two opposite lateral sides and front and rear sides of the insulating body by front and rear covering.

Because the present invention utilizes electrode pins with U-shapes to cover the two opposite lateral sides and the front and rear sides of the insulating body by front and rear covering, the front and rear covering type LED package structure can be used to turn any side of the LED package structure (front, rear, left or right face) into a contact portion to be connected for example to a printed circuit board.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
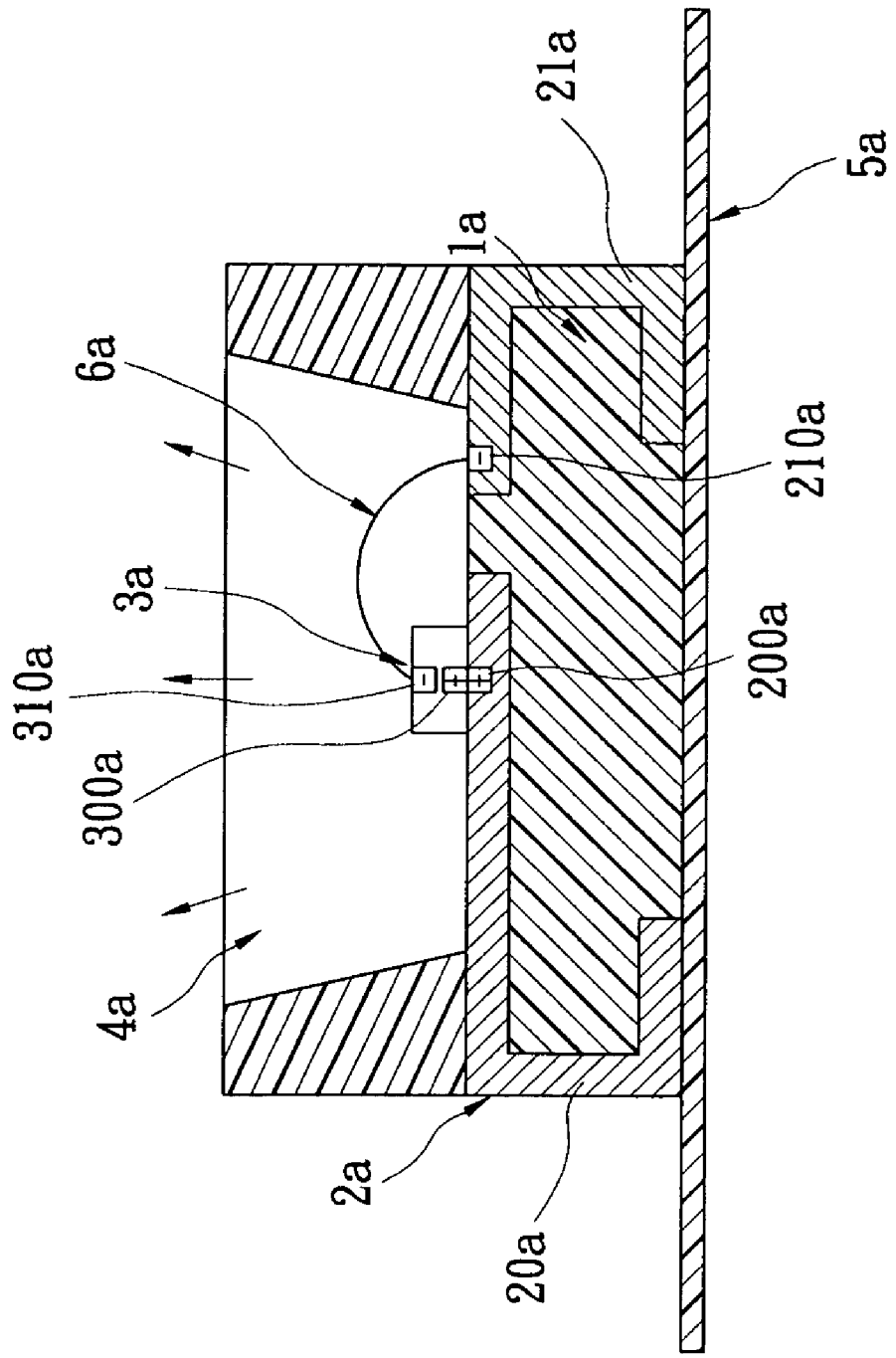
FIG. 1 is a cross-sectional, schematic view of a vertical LED chip package structure of the prior art.
Figure 2:
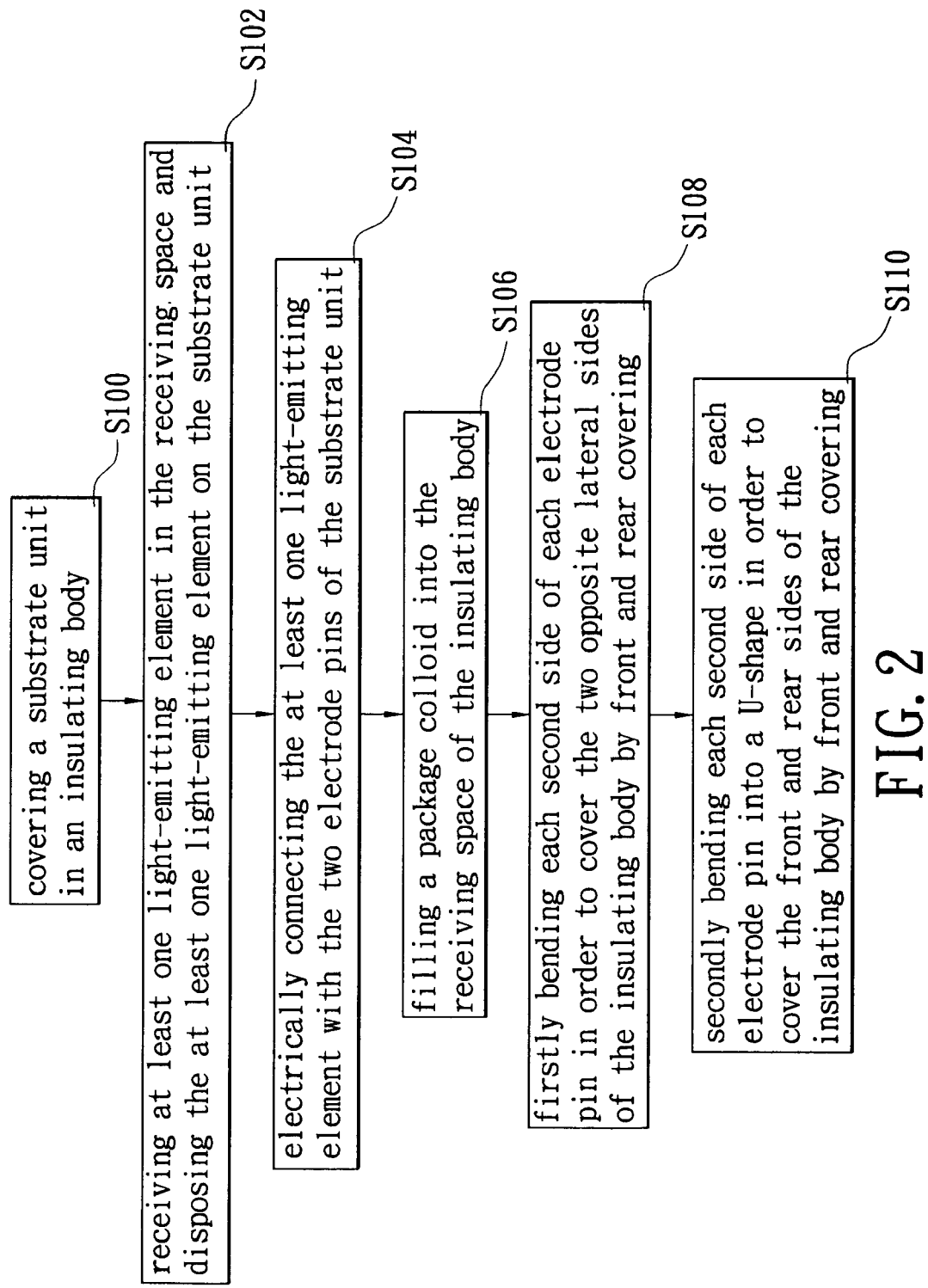
FIG. 2 is a flowchart of a method for packaging a front and rear covering type LED package structure according to the present invention.
Figure 3:
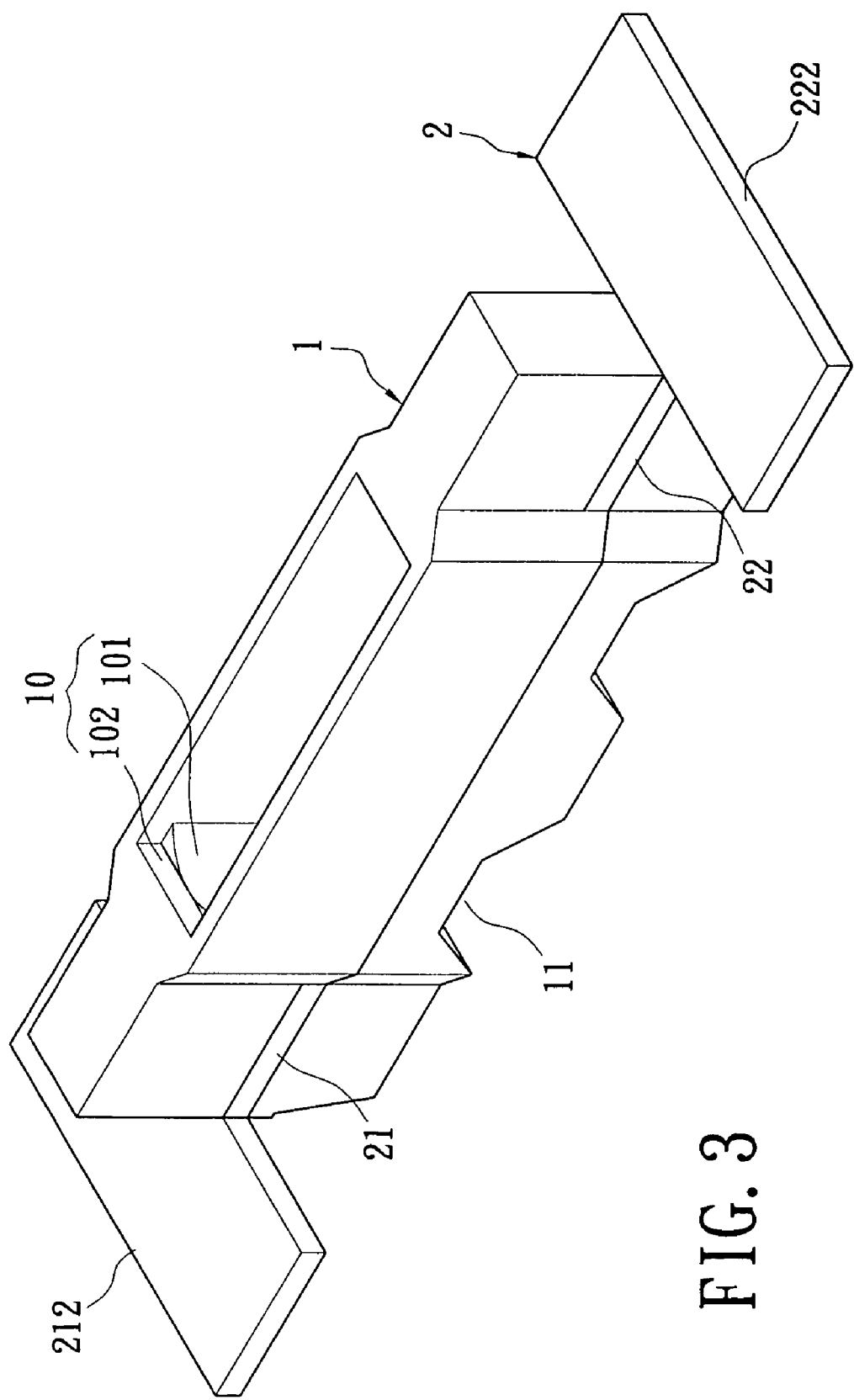
FIGS. 3 to 10 are schematic views of a front and rear covering type LED package structure of the present invention, respectively.
Figure 4:
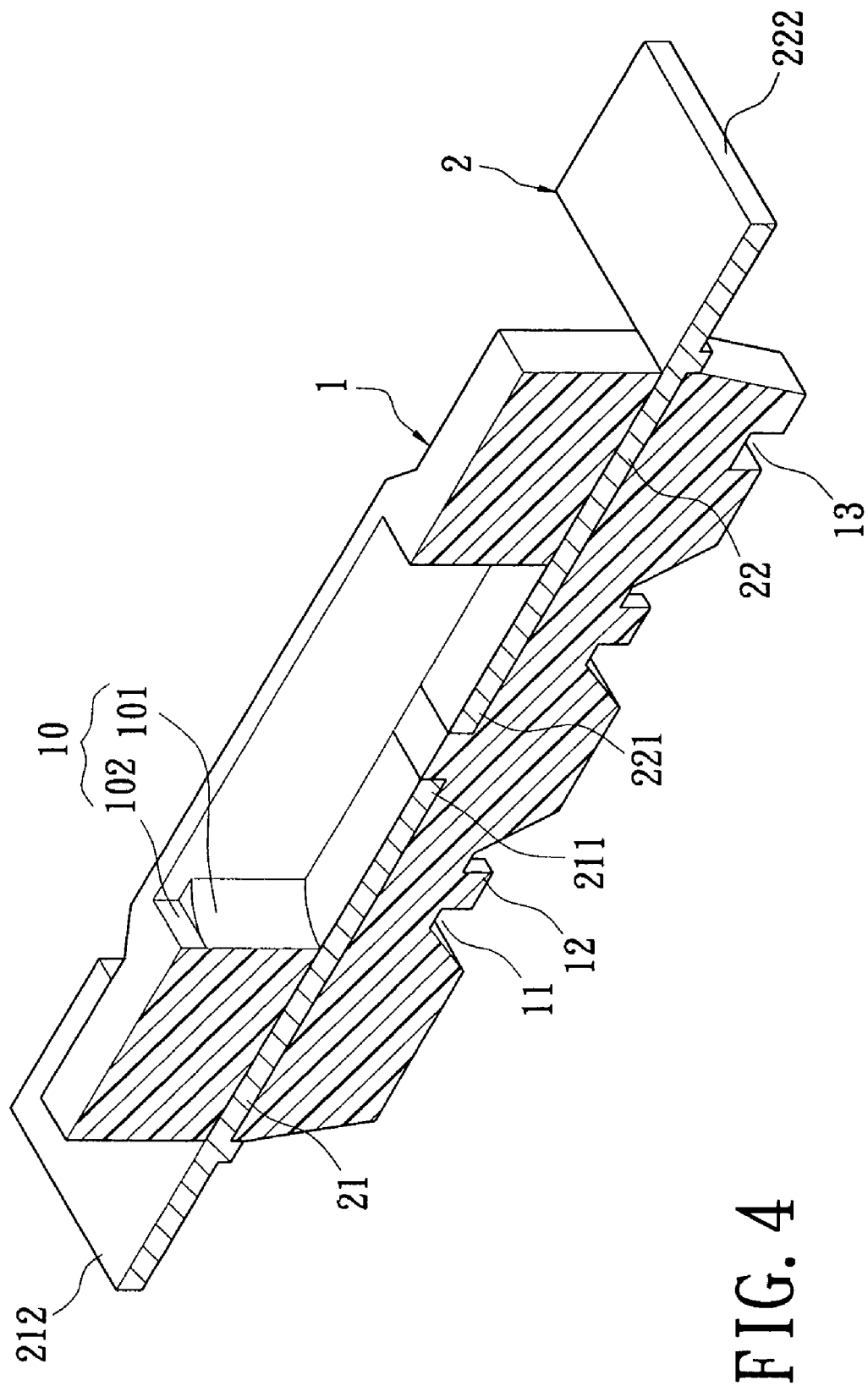
Figure 5:
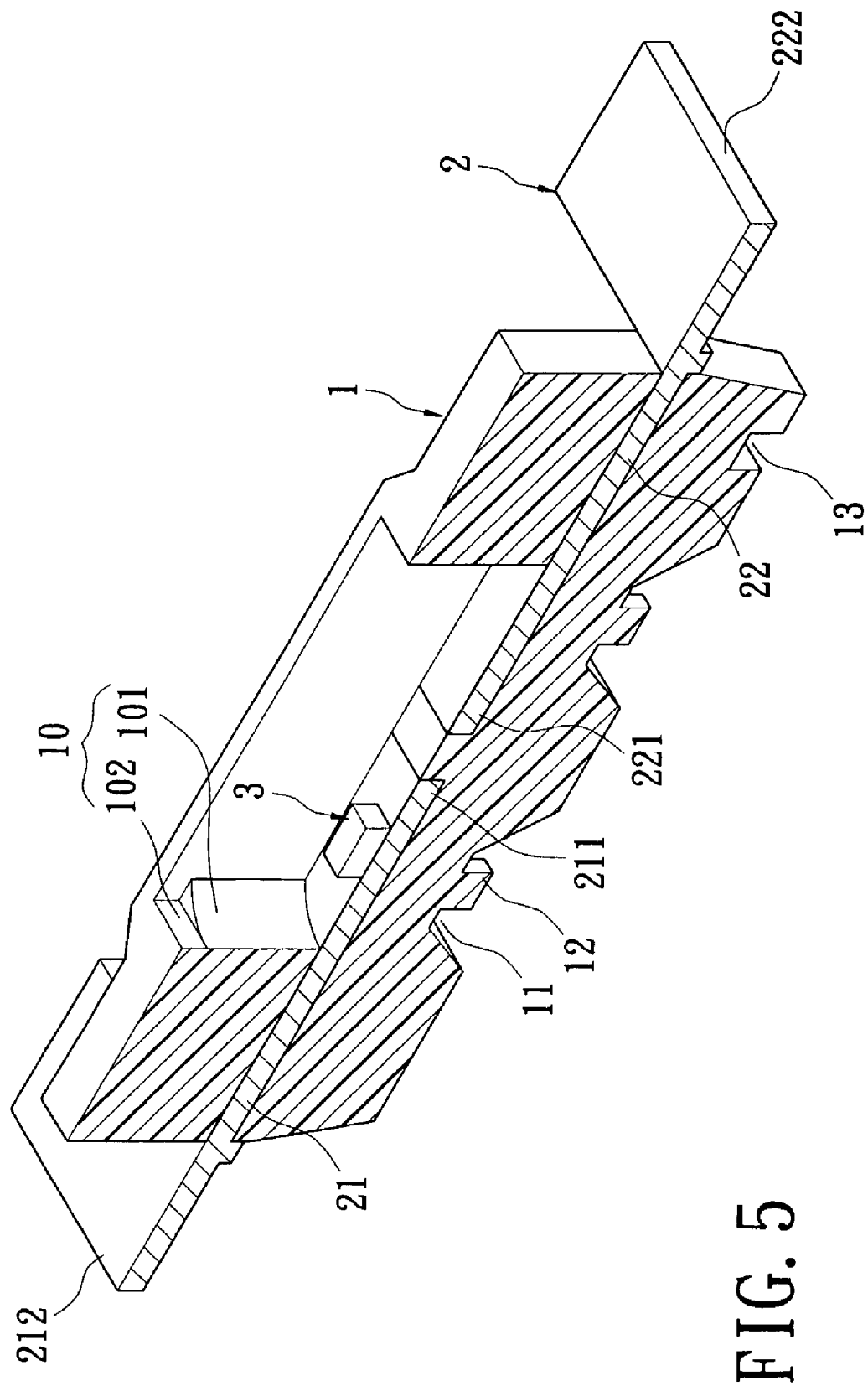

FIG. 2 shows a flowchart of a method for packaging a front and rear covering type LED package structure according to the present invention; FIGS. 3 to 10 show schematic views of a front and rear covering type LED package structure of the present invention, respectively; FIGS. 6A to 6C show three cross-sectional, schematic views of a first, a second, and a third arrangements of an LED chip according to the present invention, respectively.

Referring to FIG. 2 again, the present invention provides a method for packaging a front and rear covering type LED package structure. The method includes: referring to FIGS. 3 and 4, covering a substrate unit 2 by an insulating body 1 (S100).

The insulating body 1 has a receiving space 10 that is step-shaped. In other words, the receiving space 10 can be divided into a first space 101 and a second space 102 that is formed over the first space 101. The first space 101 has a plurality of corners with a rounded shape. The second space 102 has a plurality of corners with an angular shape. However, the space definition (such as the step-shaped space) and the corner shape (such as rounded or angular) of the receiving space 10 do not limit the present invention. Any type and shape of the receiving space 10 are protected in the present invention. For example, the receiving space 10 can be a taper space.

Furthermore, the insulating body 1 has two concave grooves 11 formed on a bottom side thereof and two ejecting pins 12 respectively disposed in the two concave grooves 11. The insulating body 1 has an identification groove 13 formed on the bottom side thereof.

In addition, the substrate unit 2 has two electrode pins 21, 22 separated from each other. Each electrode pin (21 or 22) has a first side (211 or 221) covered by the insulating body 1, and each electrode pin (21 or 22) has a second side (212 or 222) exposed outside the insulating body 1. The two electrode pins 21, 22 are positive and negative electrode pins, respectively.

Moreover, referring to FIG. 5 again, the method includes: receiving at least one light-emitting element 3 in the receiving space 10 and disposing the at least one light-emitting element 3 on the substrate unit 2 (S102). In addition, the at least one light-emitting element 3 can be an LED chip.

Figure 6:
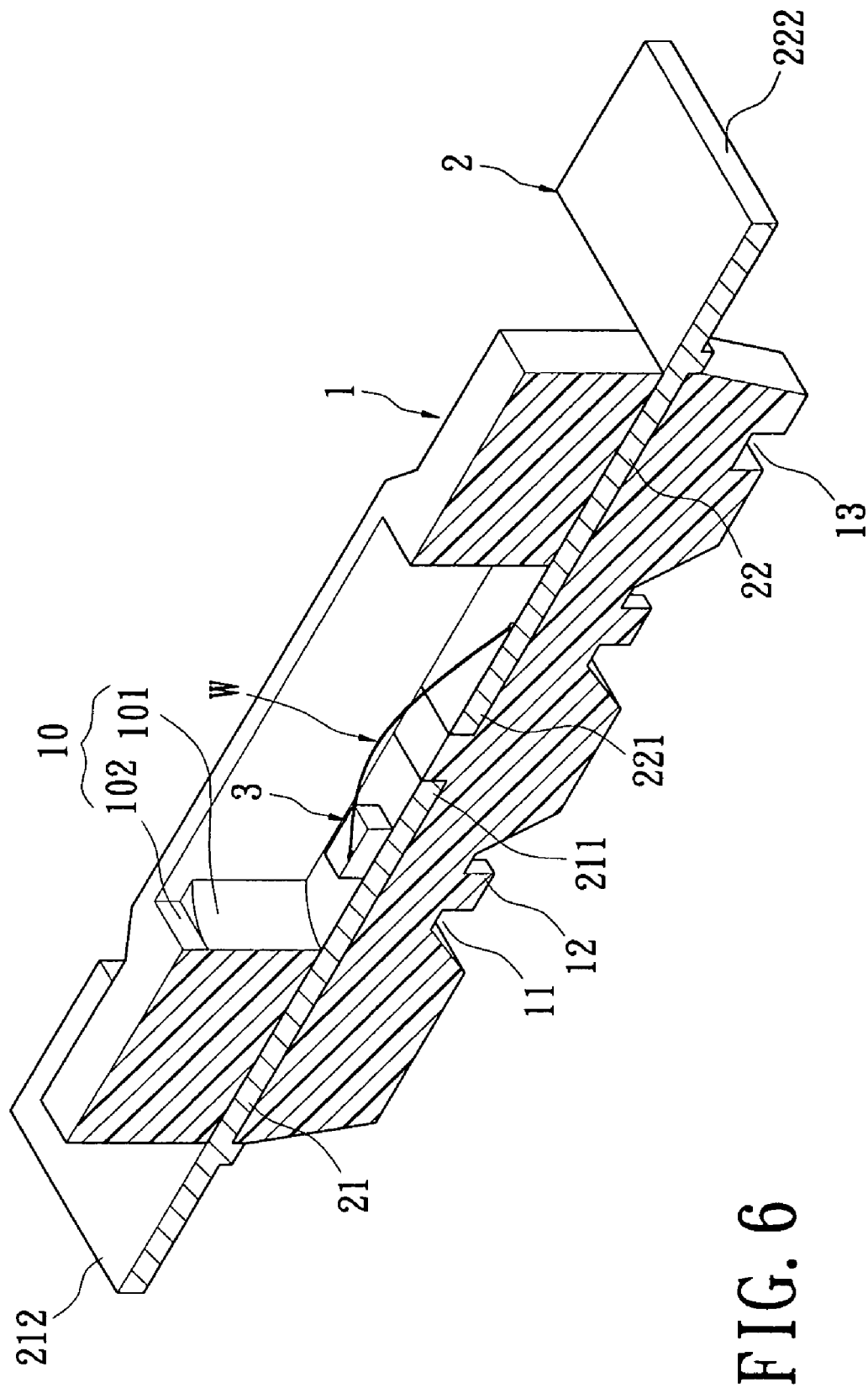
Figure 6A:
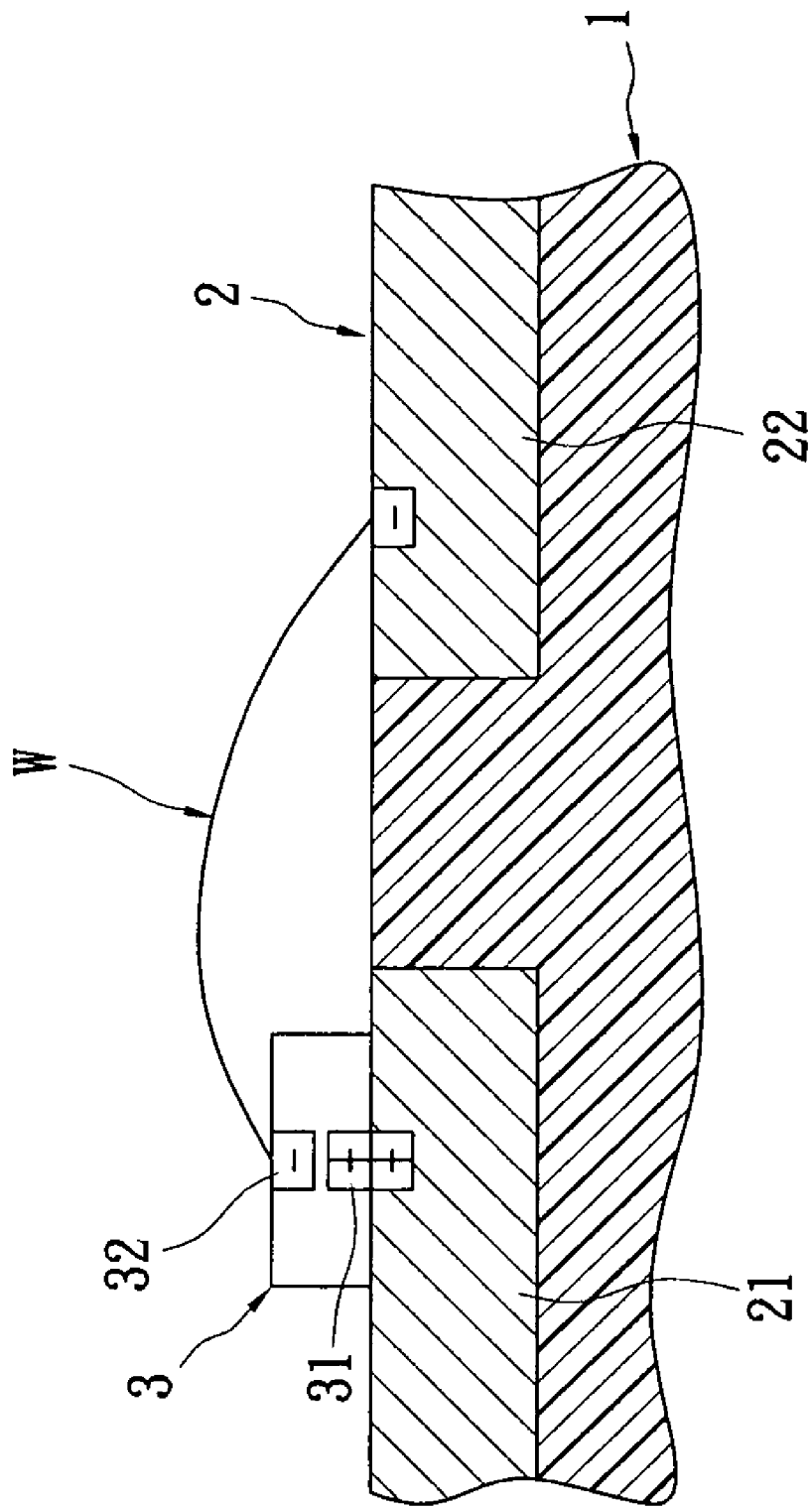
FIG. 6A is a cross-sectional, schematic view of a first arrangement of an LED chip according to the present invention.
Figure 6B:
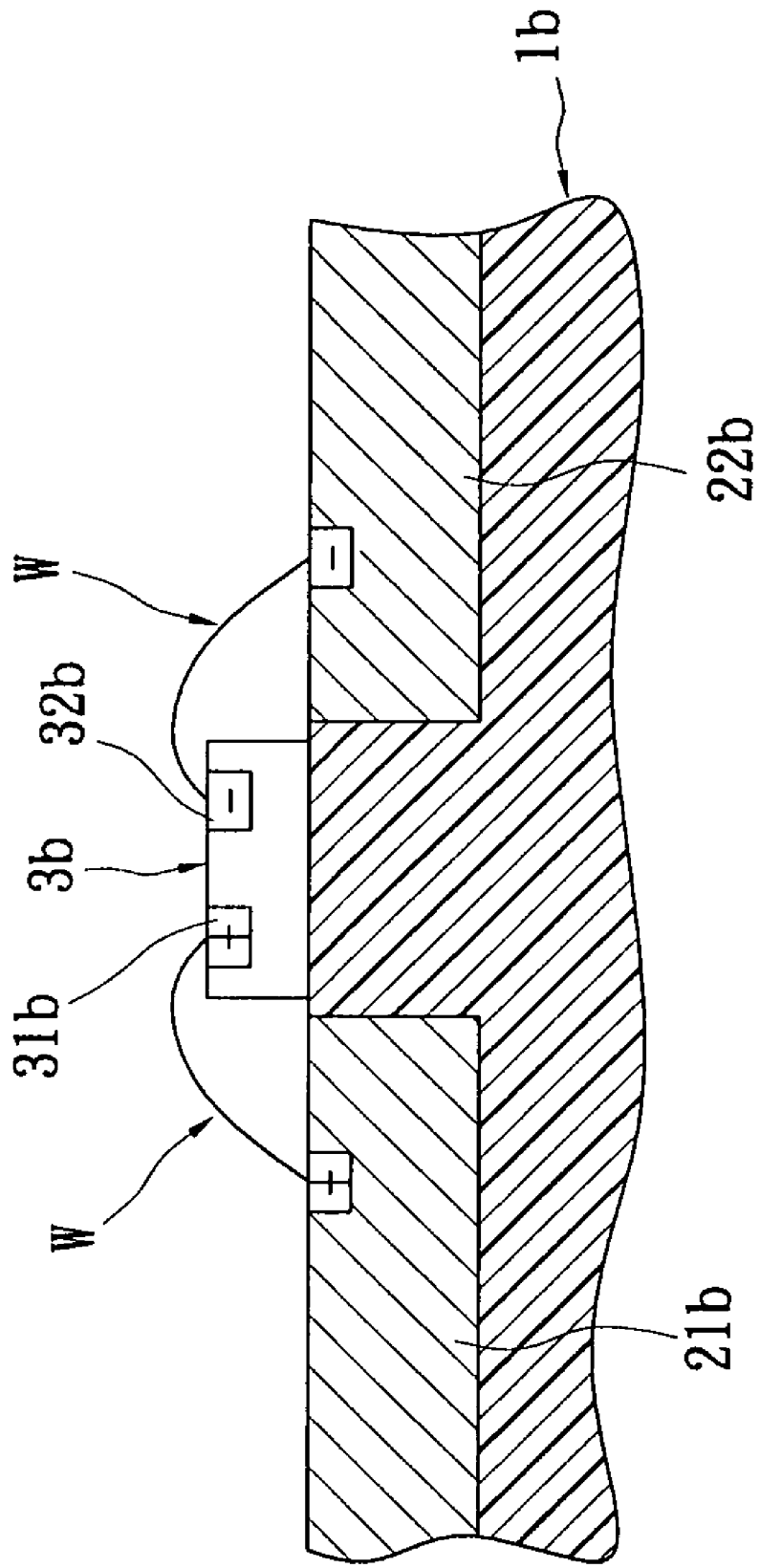
FIG. 6B is a cross-sectional, schematic view of a second arrangement of an LED chip according to the present invention.
Figure 6C:
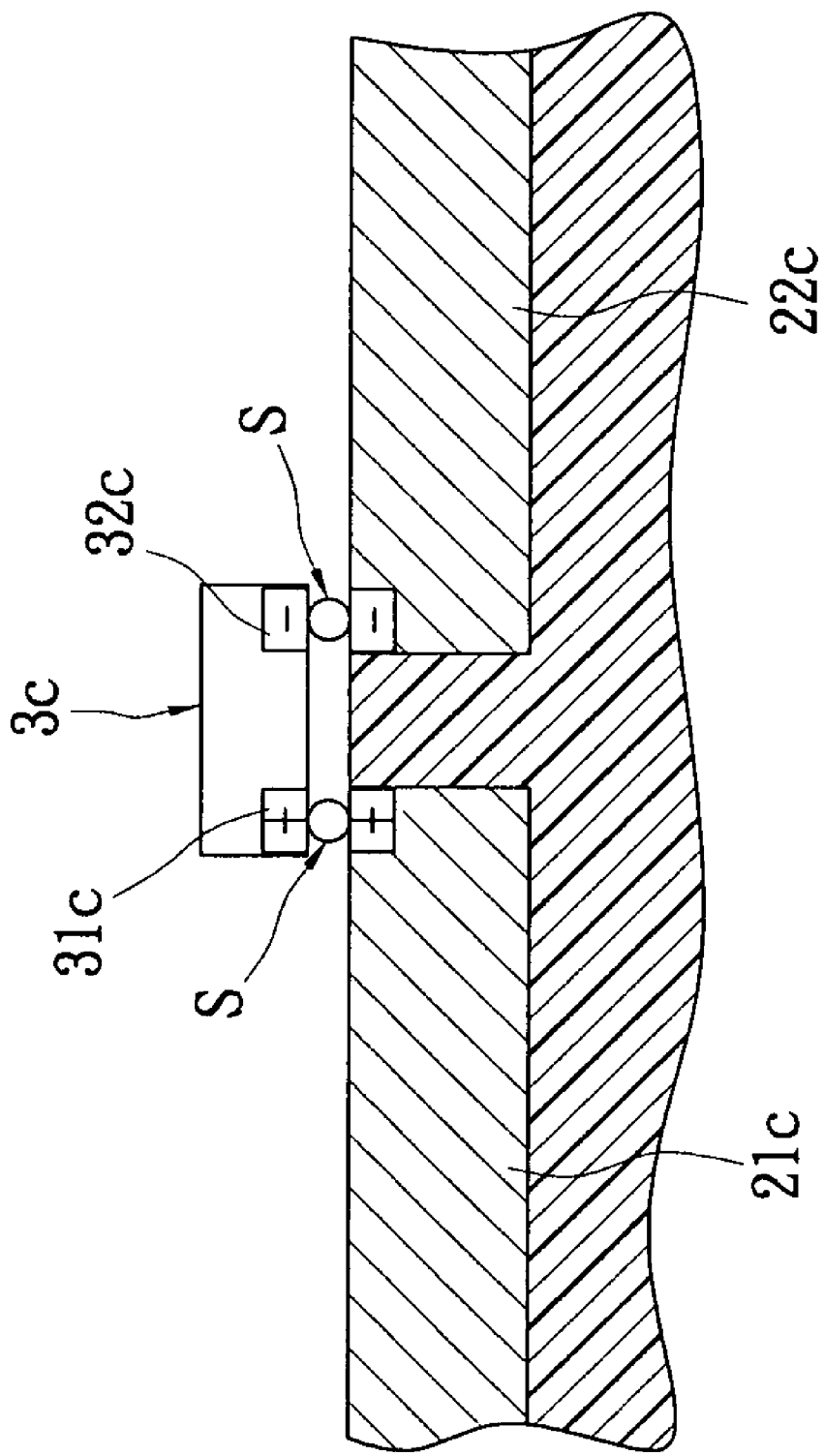
FIG. 6C is a cross-sectional, schematic view of a third arrangement of an LED chip according to the present invention.

Furthermore, referring to FIGS. 6 and 6A, the method includes: electrically connecting the at least one light-emitting element 3 with the two electrode pins 21, 22 of the substrate unit 2 (S104). In the present embodiment, the at least one light-emitting element 3 has a positive electrode 31 and a negative electrode 32 electrically connected to electrode pin 21 (the positive electrode pin) and electrode pin 22 (the negative electrode pin) via a wire W.

However, the method of electrically connecting the at least one light-emitting element 3 with the substrate unit 2 does not limit the present invention. Any method of electrically connecting the at least one light-emitting element 3 with the substrate unit 2 can be used in the present invention.

For example, referring to FIG. 6B, a light-emitting element 3b is disposed on an insulating body 1b. The light-emitting element 3b has a positive electrode 31b and a negative electrode 32b, and electrically connects to electrode pin 21b (the positive electrode pin) and electrode pin 22b (the negative electrode pin) via two wires W.

For example, referring to FIG. 6C, a light-emitting element 3c has a positive electrode 31c and a negative electrode 32c and electrically connects to electrode pin 21c (the positive electrode pin) and electrode pin 22c (the negative electrode pin) via a plurality of solder balls S.

Figure 7:
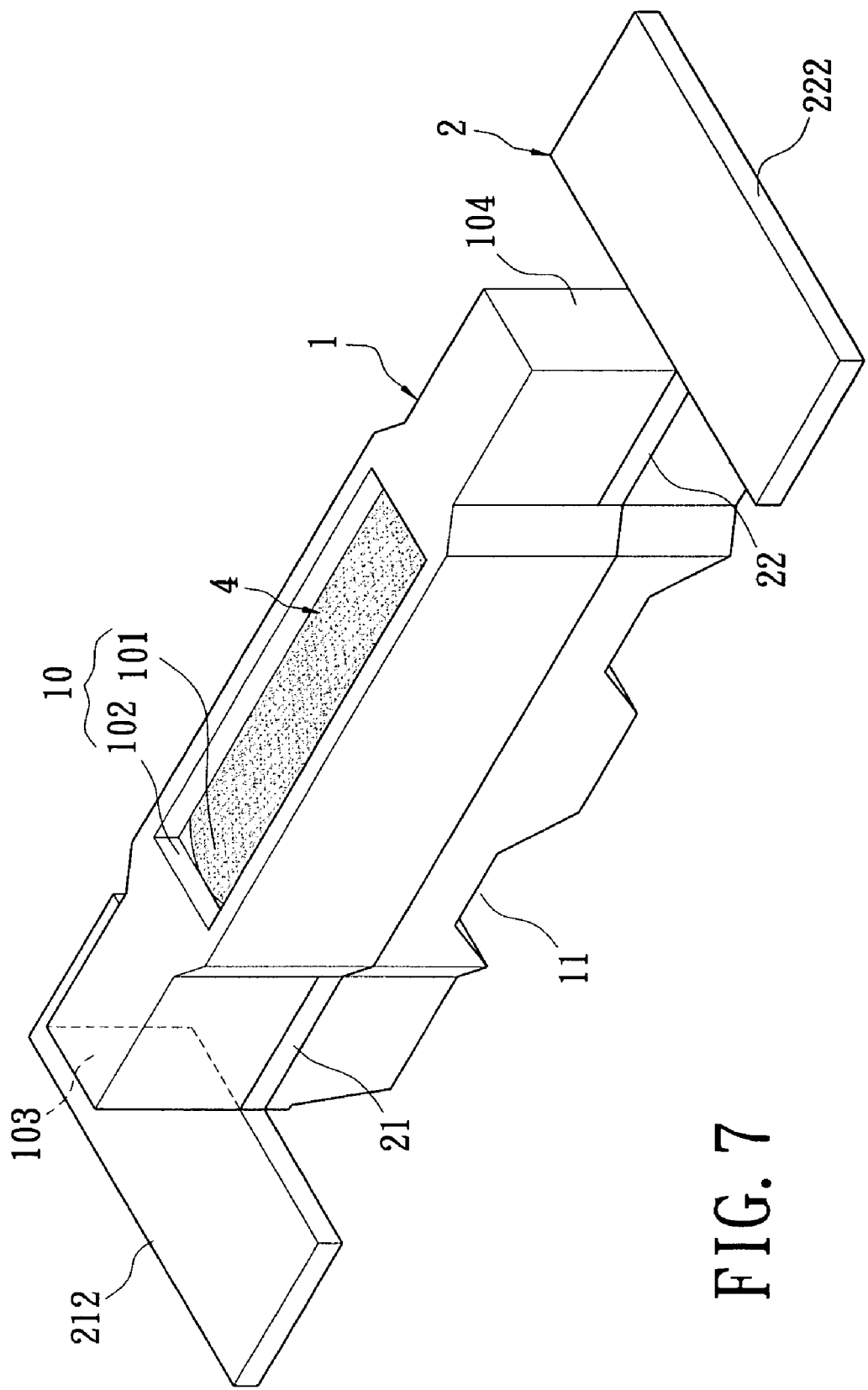

In addition, referring to FIG. 7, the method includes: filling a package colloid 4 into the receiving space 10 of the insulating body 1 (S106). The package colloid 4 can be a fluorescent colloid. In the present embodiment, the package colloid 4 is filled into the first space 101 of the receiving space 10 in order to cover the at least one light-emitting element 3 and each first side 211, 221 of each electrode pin 21, 22.

Figure 8:
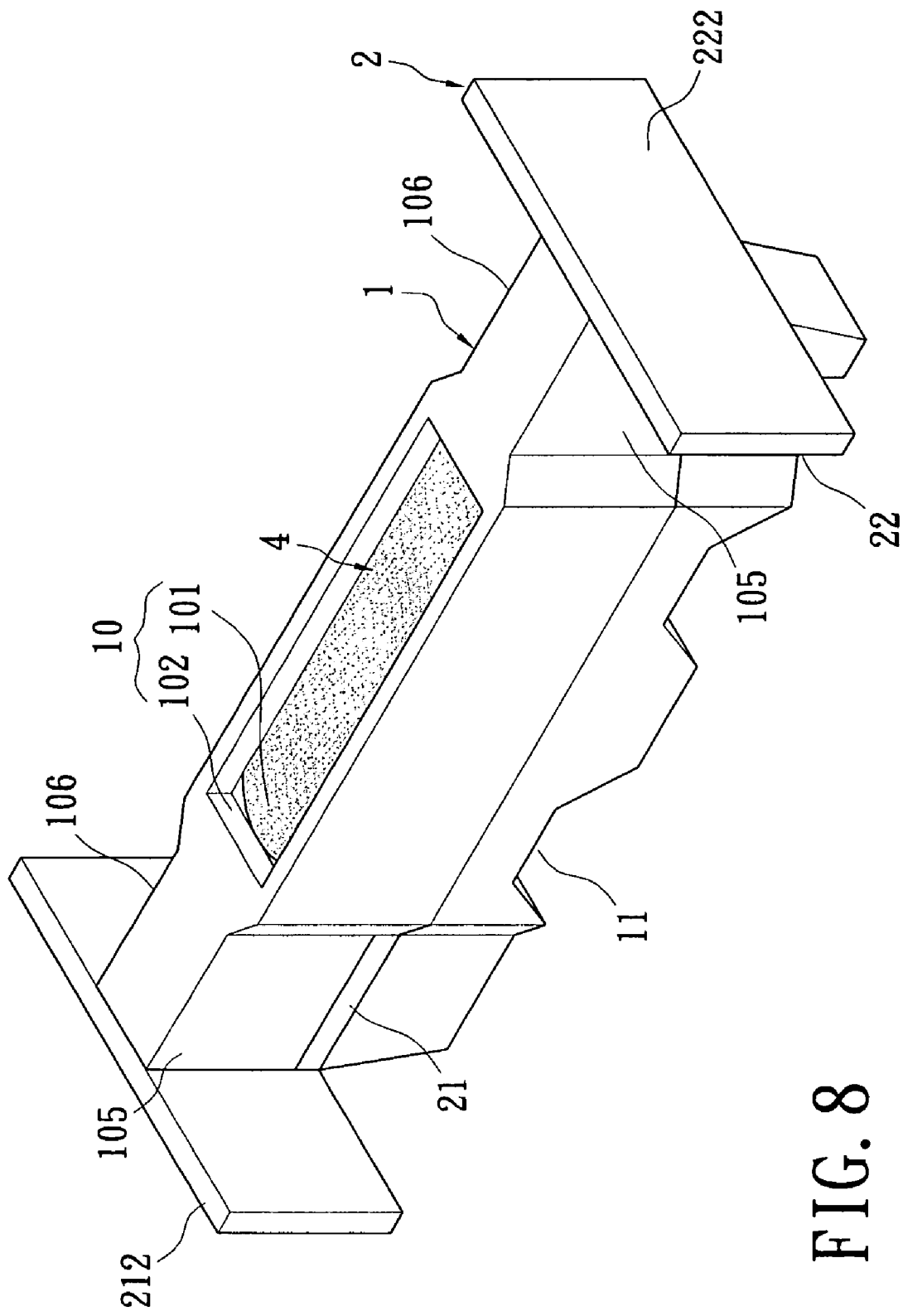

Moreover, referring to FIGS. 7 and 8, the method includes: first bending each second side 212, 222 of each electrode pin 21, 22 in order to cover the two opposite lateral sides 103, 104 of the insulating body 1 by front and rear covering (S108).

Figure 9:
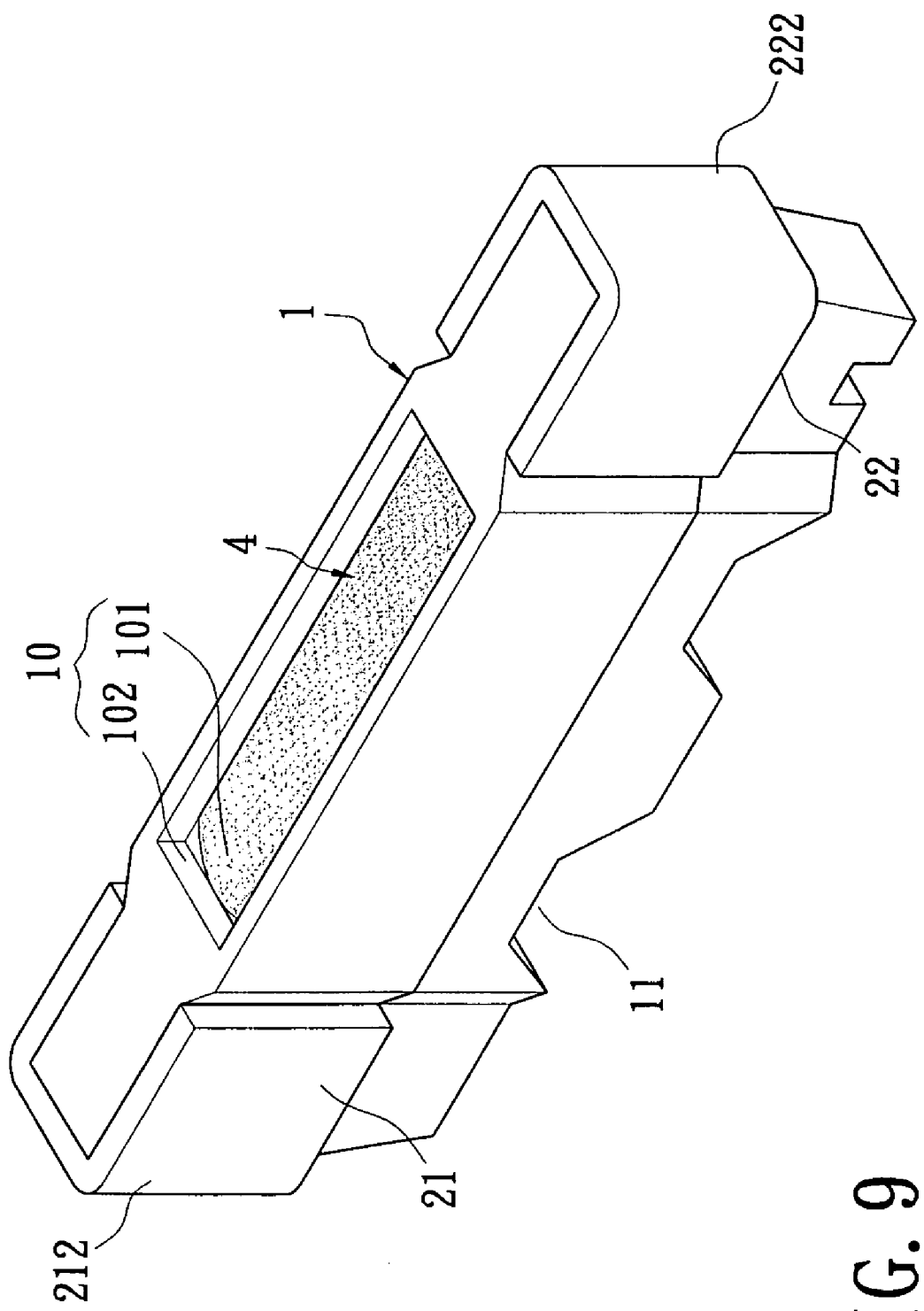

Finally, referring to FIGS. 8 and 9, the method includes: second bending each second side 212, 222 of each electrode pin 21, 22 into a U-shape in order to cover the two opposite front and rear sides 105, 106 of the insulating body 1 by front and rear covering (S110). In other words, the method includes: bending each second side 212, 222 of each electrode pin 21, 22 in order to cover the two opposite lateral sides 103, 104 and the front and rear sides 105, 106 of the insulating body 1.

Figure 10:
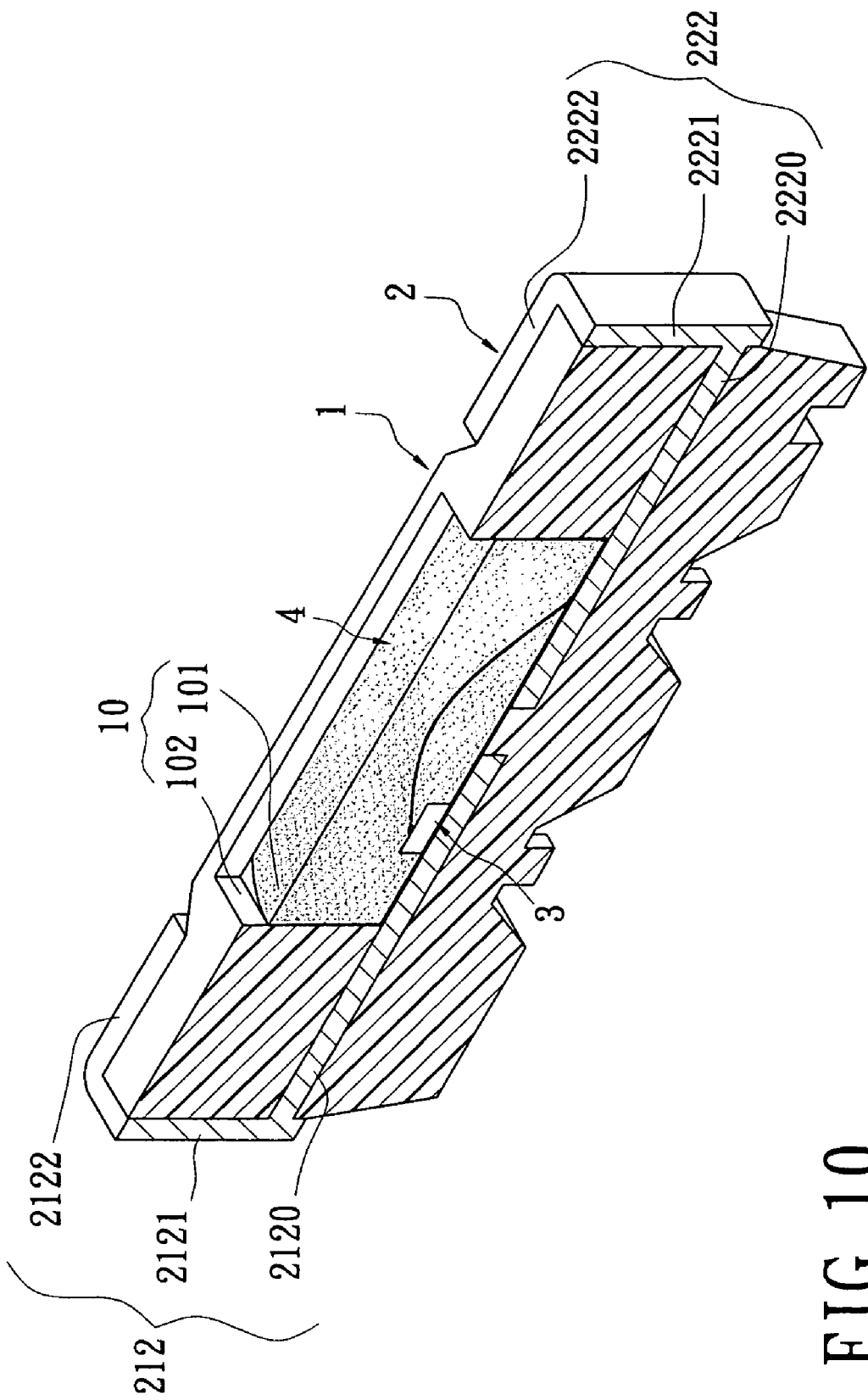

Referring to FIG. 10, the finished front and rear covering type LED package structure is composed of the insulating body 1, the substrate unit 2, the light-emitting element 3, and the package colloid 4. In addition, each second side (212, 222) of each electrode pin (21, 22) has an extended portion (2120, 2220), a first bent portion (2121, 2221) bent upward from the extended portion (2120, 2220), and two second bent portions (2122, 2222) respectively bent inward from two lateral sides of the first bent portion (2121, 2221). Each first bent portion (2121, 2221) and each two second bent portions (2122, 2222) are combined to form the U-shape.

Figure 11:
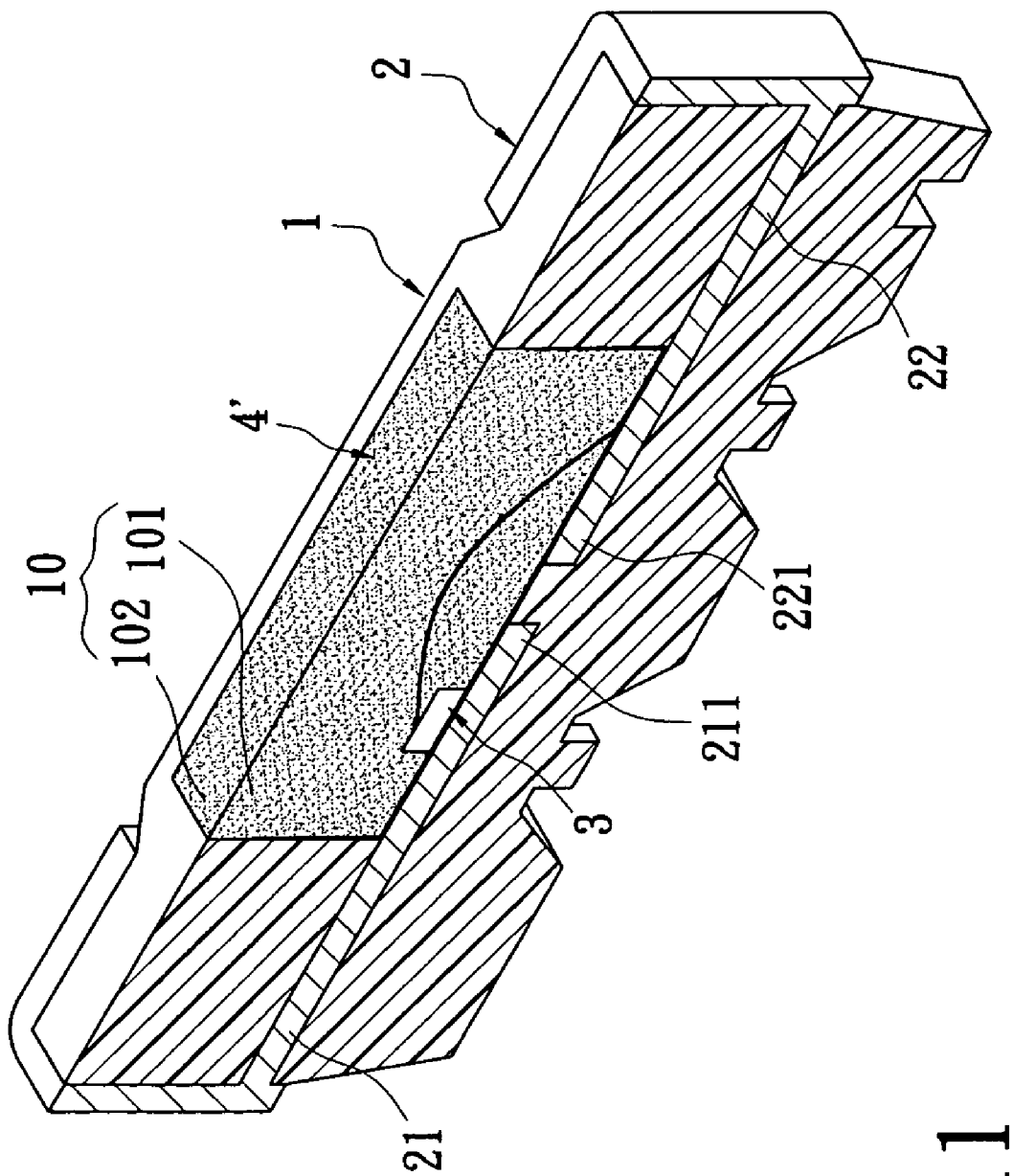
FIG. 11 is a cross-sectional, schematic view of a second arrangement of an LED chip using the packaging method according to the present invention.

FIG. 11 shows a cross-sectional, schematic view of a second arrangement of an LED chip using the package method according to the present invention. A package colloid 4' is filled into the first space 101 and the second space 102 of the receiving space 10 in order to cover the light-emitting element 3 and each first side (211, 221) of each electrode pin (21, 22). In other words, the package colloid 4' is filled in all of the receiving space 10. Therefore, the package colloid 4' has a height parallel to a top surface of the insulating body 1 and the same to that of the insulating body 1.

In conclusion, the present invention utilizes a simple two-step bending process to bend the two electrode pins (21, 22) into U-shapes in order to cover the two opposite lateral sides (103, 104) and the front and rear sides (105, 106) of an insulating body 1. Hence, the front and rear covering type LED package structure can be used to turn any side of the LED package structure (front, rear, left or right face) into a contact portion to be connected for example to a printed circuit board.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A front and rear covering type LED package structure, comprising:
    an insulating body having a receiving space and an identification groove formed on a bottom side of the insulating body;
    a substrate unit having two electrode pins separated from each other, wherein each electrode pin has a first side covered by the insulating body, and each electrode pin has a second side bent into a U-shape and exposed outside the insulating body in order to cover two opposite lateral sides and front and rear sides of the insulating body;
    at least one light-emitting element received in the receiving space and electrically connected with the two electrode pins of the substrate unit; and
    a package colloid filled into the receiving space of the insulating body.

2. The LED package structure as claimed in claim 1, wherein the insulating body has two concave grooves formed on a bottom side thereof and two ejecting pins respectively disposed in the two concave grooves.

3. The LED package structure as claimed in claim 1, wherein the receiving space is tapered.

4. The LED package structure as claimed in claim 1, wherein the receiving space is step-shaped.

5. The LED package structure as claimed in claim 1, wherein the receiving space is divided into a first space and a second space formed above the first space.

6. The LED package structure as claimed in claim 5, wherein the package colloid is filled into the first space of the receiving space in order to cover the at least one light-emitting element and each first side of each electrode pin.

7. The LED package structure as claimed in claim 5, wherein the package colloid is filled into the first space and the second space of the receiving space in order to cover the at least one light-emitting element and each first side of each electrode pin.

8. The LED package structure as claimed in claim 5, wherein corners of the first space are rounded.

9. The LED package structure as claimed in claim 5, wherein corners of the second space are angular.

10. The LED package structure as claimed in claim 1, wherein the two electrode pins are a positive electrode pin and a negative electrode pin, and the at least one light-emitting element has a positive electrode side and a negative electrode side respectively and electrically connected to the positive electrode pin and the negative electrode pin.

11. The LED package structure as claimed in claim 1, wherein the at least one light-emitting element is an LED chip.

12. The LED package structure as claimed in claim 1, wherein the package colloid is a fluorescent colloid.

13. The LED package structure as claimed in claim 1, wherein each second side of each electrode pin has an extended portion, a first bent portion bent upward from the extended portion, and two second bent portions respectively bent inward from two lateral sides of the first bent portion, wherein each first bent portion and the two adjacent second bent portions are forming a U-shape.

14. A method for packaging a front and rear covering type LED package structure, comprising:
   covering a substrate unit in an insulating body, wherein the insulating body has a receiving space and an identification groove formed on a bottom side of the insulating body, and the substrate unit has two electrode pins separated from each other, wherein each electrode pin has a first side covered by the insulating body, and each electrode pin has a second side exposed outside the insulating body;
   receiving at least one light-emitting element in the receiving space and disposing the at least one light-emitting element on the substrate unit;
   electrically connecting the at least one light-emitting element with the two electrode pins of the substrate unit;
   filling a package colloid into the receiving space of the insulating body; and
   bending each second side of each electrode pin in order to cover two opposite lateral sides and front and rear sides of the insulating body.

15. The method as claimed in claim 14, wherein the insulating body has two concave grooves formed on a bottom side thereof and two ejecting pins respectively disposed in the two concave grooves.

16. The method as claimed in claim 14, wherein the receiving space is tapered.

17. The method as claimed in claim 14, wherein the receiving space is step-shaped.

18. The method as claimed in claim 14, wherein the receiving space is divided into a first space and a second space formed over the first space.

19. The method as claimed in claim 18, wherein the package colloid is filled into the first space of the receiving space in order to cover the at least one light-emitting element and each first side of each electrode pin.

20. The method as claimed in claim 18, wherein the package colloid is filled into the first space and the second space of the receiving space in order to cover the at least one light-emitting element and each first side of each electrode pin.

21. The method as claimed in claim 18, wherein corners of the first space are rounded.

22. The method as claimed in claim 18, wherein corners of the second space are angular.

23. The method as claimed in claim 14, wherein the two electrode pins are a positive electrode pin and a negative electrode pin, and the at least one light-emitting element has a positive electrode and a negative electrode electrically connected to the positive electrode pin and the negative electrode pin, respectively.

24. The method as claimed in claim 14, wherein the at least one light-emitting element is an LED chip.

25. The method as claimed in claim 14, wherein the package colloid is a fluorescent colloid.

26. The method as claimed in claim 14, wherein the step of bending each second side of each electrode pin further comprises:
   firstly bending each second side of each electrode pin in order to cover the two opposite lateral sides of the insulating body by front and rear covering; and
   secondly bending each second side of each electrode pin into a U-shape in order to cover the front and rear sides of the insulating body by front and rear covering.

27. The method as claimed in claim 26, wherein each second side of each electrode pin has an extended portion, a first bent portion bent upward from the extended portion, and two second bent portions bent inward from two lateral sides of the first bent portion, wherein each first bent portion and the two adjacent second bent portions are forming a U-shape.

* * * * *